United States Patent
You et al.

(10) Patent No.: US 9,903,154 B2
(45) Date of Patent: Feb. 27, 2018

(54) LOW-EMISSIVITY COATING FILM, METHOD FOR MANUFACTURING SAME, AND FUNCTIONAL CONSTRUCTION MATERIAL FOR WINDOW AND DOORS INCLUDING SAME

(71) Applicant: LG Hausys, Ltd., Seoul (KR)

(72) Inventors: Hyun-Woo You, Incheon (KR); Youn-Ki Jun, Gwacheon-si (KR); Dae-Hoon Kwon, Seoul (KR)

(73) Assignee: LG Hausys, Ltd., Seoul (KR)

(*) Notice: Subject to any disclaimer, the term of this patent is extended or adjusted under 35 U.S.C. 154(b) by 0 days.

(21) Appl. No.: 15/100,637

(22) PCT Filed: Dec. 11, 2014

(86) PCT No.: PCT/KR2014/012218
§ 371 (c)(1),
(2) Date: Jun. 1, 2016

(87) PCT Pub. No.: WO2015/088267
PCT Pub. Date: Jun. 18, 2015

(65) Prior Publication Data
US 2016/0298384 A1    Oct. 13, 2016

(30) Foreign Application Priority Data
Dec. 12, 2013  (KR) .................. 10-2013-0154919

(51) Int. Cl.
*B32B 15/04*    (2006.01)
*B32B 17/06*    (2006.01)
(Continued)

(52) U.S. Cl.
CPC .............. *E06B 9/24* (2013.01); *B05D 7/50* (2013.01); *C03C 17/36* (2013.01); *C03C 17/366* (2013.01);
(Continued)

(58) Field of Classification Search
USPC ....... 428/426, 428, 432, 433, 434, 688, 689, 428/697, 698, 699, 701, 702
See application file for complete search history.

(56) References Cited

U.S. PATENT DOCUMENTS 6,586,102 B1 * 7/2003 Stachowiak ............ C03C 17/36
428/426
6,589,658 B1 * 7/2003 Stachowiak ............ C03C 17/36
428/426
(Continued)

FOREIGN PATENT DOCUMENTS

KR    1020110033769 A    3/2011
KR    1020110062566 A    6/2011
(Continued)

OTHER PUBLICATIONS

International Search Report dated Mar. 12, 2015 corresponding to International Application PCT/KR2014/012218.
(Continued)

*Primary Examiner* — Lauren R Colgan
(74) *Attorney, Agent, or Firm* — Hauptman Ham, LLP

(57) ABSTRACT

The present invention relates to a low-emissivity coating film comprising: a base; a low-emissivity coating layer; and an uppermost coating layer, wherein the uppermost coating layer has a multilayer structure sequentially including, from the low-emissivity coating layer, a metal layer, a metal oxide layer and a silicon-based composite metal oxynitride layer.

11 Claims, 5 Drawing Sheets

(51) Int. Cl.

| | | |
|---|---|---|
| *E06B 9/24* | (2006.01) | |
| *C09D 5/00* | (2006.01) | |
| *C09D 7/12* | (2006.01) | |
| *E06B 3/00* | (2006.01) | |
| *H05K 9/00* | (2006.01) | |
| *C09D 1/00* | (2006.01) | |
| *B05D 7/00* | (2006.01) | |
| *C09D 5/33* | (2006.01) | |
| *C23C 16/06* | (2006.01) | |
| *C03C 17/36* | (2006.01) | |

(52) U.S. Cl.
 CPC ...... *C03C 17/3626* (2013.01); *C03C 17/3644* (2013.01); *C03C 17/3689* (2013.01); *C09D 1/00* (2013.01); *C09D 5/00* (2013.01); *C09D 5/004* (2013.01); *C09D 7/12* (2013.01); *C09D 7/1216* (2013.01); *C23C 16/06* (2013.01); *E06B 3/00* (2013.01); *H05K 9/0003* (2013.01); *E06B 2009/2417* (2013.01)

(56) References Cited

U.S. PATENT DOCUMENTS

| | | | | |
|---|---|---|---|---|
| 6,802,943 | B2 * | 10/2004 | Stachowiak | C03C 17/36 204/192.12 |
| 7,153,578 | B2 * | 12/2006 | Chonlamaitri | C03C 17/36 428/428 |
| 7,390,572 | B2 * | 6/2008 | Butz | C03C 17/36 428/428 |
| 8,263,227 | B2 * | 9/2012 | Disteldorf | C03C 17/36 428/428 |
| 8,506,001 | B2 * | 8/2013 | Benito Gutierrez | C03C 17/36 296/201 |
| 8,815,420 | B2 * | 8/2014 | Krasnov | C03C 17/36 428/432 |
| 2004/0058169 | A1 | 3/2004 | Wang et al. | |
| 2004/0197574 | A1 * | 10/2004 | Stachowiak | C03C 17/3435 428/432 |
| 2006/0121290 | A1 * | 6/2006 | Chonlamaitri | C03C 17/36 428/428 |
| 2006/0134436 | A1 * | 6/2006 | Maschwitz | C03C 17/36 428/426 |
| 2007/0281171 | A1 * | 12/2007 | Coster | B32B 17/10036 428/432 |
| 2009/0324967 | A1 * | 12/2009 | Disteldorf | C03C 17/36 428/428 |
| 2011/0008641 | A1 * | 1/2011 | Di Stefano | C03C 17/36 428/552 |
| 2011/0261442 | A1 * | 10/2011 | Knoll | C03C 17/36 359/360 |
| 2011/0262726 | A1 * | 10/2011 | Knoll | C03C 17/36 428/213 |
| 2012/0171443 | A1 * | 7/2012 | Jun | C03C 17/3618 428/216 |
| 2013/0216860 | A1 * | 8/2013 | Imran | C03C 17/3618 428/623 |

FOREIGN PATENT DOCUMENTS

| | | |
|---|---|---|
| KR | 1020130051521 A | 5/2013 |
| WO | 2011/037365 A2 | 3/2011 |
| WO | 2012165501 A1 | 12/2012 |

OTHER PUBLICATIONS

European Search Report dated Nov. 3, 2016 for European Application No. 14869874.9-1302.

* cited by examiner

LOW-EMISSIVITY COATING FILM, METHOD FOR MANUFACTURING SAME, AND FUNCTIONAL CONSTRUCTION MATERIAL FOR WINDOW AND DOORS INCLUDING SAME

CROSS REFERENCE TO RELATED APPLICATION

This application claims the priority of Korean Patent Application No. 10-2013-0154919, filed on Dec. 12, 2013 in the KIPO (Korean Intellectual Property Office)./Further, this application is the National Phase application of International Application No. PCT/KR2014/012218 filed Dec. 11, 2014, which designates the United States and was published in Korean.

TECHNICAL FIELD

The present invention relates to a low-emissivity coating film, and a method for manufacturing the same, and a functional construction material for window and doors including the same.

BACKGROUND ART

A low-emissivity glass refers to a glass in which a low-emissivity layer containing a metal having high reflectivity in an infrared region such as silver (Ag) is deposited as a thin film. The low-emissivity glass is a functional material having an energy saving effect of buildings by reflecting radiant rays in the infrared region to block outdoor solar radiant heat in summer and to preserve interior heat radiant heat.

Silver (Ag) generally used as the low-emissivity layer is oxidized when being exposed during air, such that dielectric layers are deposited as anti-oxidation films on an upper part and a lower part of the low-emissivity layer. The dielectric layers serve to increase visible light transmittance.

DISCLOSURE

Technical Problem

It is an aspect of the present invention to provide a low-emissivity coating film including a base, a low-emissivity coating layer and an uppermost coating layer, wherein the uppermost coating layer has a multilayer structure sequentially including, from the low-emissivity coating layer, a metal layer, a metal oxide layer and a silicon-based composite metal oxynitride layer.

However, technical problems to be achieved in the present invention are not limited to the above-mentioned problems, and other non-mentioned technical problems will be clearly understood to those skilled in the art from the following descriptions.

Technical Solution

In accordance with one aspect of the present invention, there is provided a low-emissivity coating film including: a base; a low-emissivity coating layer; and an uppermost coating layer, wherein the uppermost coating layer has a multilayer structure sequentially including, from the low-emissivity coating layer, a metal layer, a metal oxide layer and a silicon-based composite metal oxynitride layer.

The metal layer may include at least one selected from silicon, aluminum, titanium, zirconium, silicon-based composite metal, titanium-based composite metal, zirconium-based composite metal, and combinations thereof.

The metal oxide layer may include at least one selected from silicon oxide, aluminum oxide, titanium oxide, zirconium oxide, silicon-based composite metal oxide, titanium-based composite metal oxide, zirconium-based composite metal oxide, and combinations thereof.

The low-emissivity coating layer may have a multilayer structure sequentially including, from the substrate, a first dielectric layer, a first low-emissivity protection layer, a low-emissivity layer, a second low-emissivity protection layer, and a second dielectric layer.

The first dielectric layer or the second dielectric layer may include at least one selected from the group consisting of titanium oxide, tin zinc oxide, zinc oxide, zinc aluminum oxide, tin oxide, bismuth oxide, silicon nitride, silicon aluminum nitride, silicon tin nitride, and combinations thereof, or may include the at least one doped with at least one element selected from the group consisting of bismuth (Bi), boron (B), aluminum (Al), silicon (Si), magnesium (Mg), antimony (Sb), beryllium (Be), and combinations thereof.

The first low-emissivity protection layer or the second low-emissivity protection layer may include at least one selected from the group consisting of nickel (Ni), chromium (Cr), nickel (Ni)-chromium (Cr) alloy, titanium (Ti) and combinations thereof.

The low-emissivity layer may include at least one selected from the group consisting of silver (Ag), gold (Au), copper (Cu), aluminum (Al), platinum (Pt), ion-doped metal oxides, and combinations thereof.

The metal layer may have a thickness of 0.5 nm to 5 nm.

The metal oxide layer may have a thickness of 0.5 nm to 5 nm.

The silicon-based composite metal oxynitride layer may have a thickness of 2 nm to 20 nm.

In accordance with another aspect of the present invention, there is provided a method for manufacturing a low-emissivity coating film including: (a) preparing a low-emissivity coating layer stacked on at least one surface of a base; (b) forming a metal layer by depositing a metal on the low-emissivity coating layer; and (c) forming a metal oxide layer on the metal layer, and forming a silicon-based composite metal oxynitride layer by depositing silicon-based composite metal oxynitride.

The metal layer in (b) may include at least one selected from silicon, aluminum, titanium, zirconium, silicon-based composite metal, titanium-based composite metal, zirconium-based composite metal, and combinations thereof.

The metal oxide layer in (c) may include at least one selected from silicon oxide, aluminum oxide, titanium oxide, zirconium oxide, silicon-based composite metal oxide, titanium-based composite metal oxide, zirconium-based composite metal oxide, and combinations thereof.

The forming of the metal oxide layer in (c) may be performed by partially oxidizing a surface of the metal layer through a post oxidation process of the surface of the metal layer.

The post oxidation process may be performed by using at least one reactive gas selected from the group consisting of oxygen ($O_2$), nitrogen ($N_2$) and argon (Ar).

The partially oxidizing of the surface of the metal layer and the depositing of the silicon-based composite metal oxynitride in (c) may be continuously performed in-situ.

In accordance with another aspect of the present invention, there is provided a functional construction material for window and doors including the low-emissivity coating film as described above.

Advantageous Effects

The low-emissivity coating film according to the present invention may have excellent abrasion resistance which is a mechanical property, and may have excellent moisture resistance, acid resistance and basic resistance which are chemical properties. Further, in the method for manufacturing the low-emissivity coating film according to the present invention, oxidation of a surface of a metal layer through a post oxidation process of the surface of the metal layer and deposition of silicon-based composite metal oxynitride may be continuously performed in-situ, thereby increasing process efficiency.

BEST MODE

Figure 1:
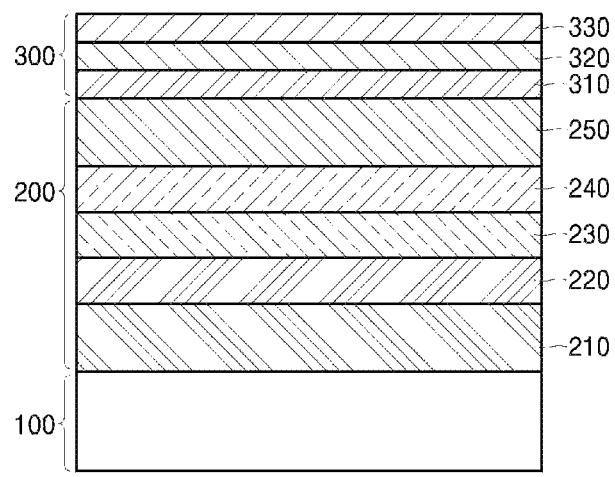
FIG. 1 is a cross-sectional view schematically showing a low-emissivity coating film according to an exemplary embodiment of the present invention.

The present inventors researched and manufactured a low-emissivity coating film including an uppermost coating layer having a multilayer structure, wherein the uppermost coating layer sequentially includes a metal layer, a metal oxide layer and a silicon-based composite metal oxynitride layer, and confirmed that the manufactured low-emissivity coating film had excellent mechanical properties and chemical properties, and completed the present invention.

Hereinafter, exemplary embodiments of the present invention will be described in detail with reference to the accompanying drawings so that those skilled in the art may easily practice the present invention. The present invention may be implemented in various different ways and is not limited to the exemplary embodiments provided in the present description.

The description of parts deviating from the subject matter of the present invention will be omitted in order to clearly describe the present invention. Like reference numerals designate like elements throughout the specification.

In the drawings, thicknesses of various layers and regions are exaggerated for clarity. In the drawings, thicknesses of partial layers and regions are exaggerated for convenience of explanation.

Hereinafter, formation of any configuration "on (or below)" of a substrate means that any configuration is formed while contacting an upper surface (or a lower surface) of the substrate, and should not be intended to exclude other configurations between the substrate and any configuration formed on (or below) the substrate.

The present invention provides a low-emissivity coating film including a base; a low-emissivity coating layer; and an uppermost coating layer, wherein the uppermost coating layer has a multilayer structure sequentially including, from the low-emissivity coating layer, a metal layer, a metal oxide layer and a silicon-based composite metal oxynitride layer.

FIG. 1 is a cross-sectional view schematically showing the low-emissivity coating film according to an exemplary embodiment of the present invention.

As shown in FIG. 1, the low-emissivity coating film according to an exemplary embodiment of the present invention includes a base 100; a low-emissivity coating layer 200 having a multilayer structure sequentially including, from the substrate, a first dielectric layer 210, a first low-emissivity protection layer 220, a low-emissivity layer 230, a second low-emissivity protection layer 240, and a second dielectric layer 250; and an uppermost coating layer 300 having a multilayer structure sequentially including, from the low-emissivity coating layer, a metal layer 310, a metal oxide layer 320 and a silicon-based composite metal oxynitride layer 330.

Substrate (100)

The substrate 100 may be a transparent substrate having high visible light transmittance. For example, the substrate may be a glass or a transparent plastic substrate having about 80% to about 100% of visible light transmittance. For example, as the substrate, a glass used for construction may be used without limitation. In addition, a thickness of the substrate may be about 2 mm to about 12 mm, and may vary depending on use purpose and function, but the thickness of the substrate is not limited thereto.

Low-Emissivity Coating Layer (200)

The low-emissivity coating layer (200) may have a multilayer structure sequentially including, from the substrate, the first dielectric layer 210, the first low-emissivity protection layer 220, the low-emissivity layer 230, the second low-emissivity protection layer 240, and the second dielectric layer 250.

The first dielectric layer 210 and the second dielectric layer 250 may function as an anti-oxidation film of the low-emissivity layer 230 since it is general that the metal used as the low-emissivity layer 230 is easily oxidized. In addition, the first dielectric layer 210 and the second dielectric layer 250 serve to increase visible light transmittance.

The first dielectric layer 210 and the second dielectric layer 250 may contain various metal oxides, metal nitrides, etc., but the present invention is not limited thereto. Materials used for protecting the low-emissivity layer 230 known in the art may be used without limitation. The first dielectric layer 210 and the second dielectric layer 250 may include, for example, at least one selected from the group consisting of titanium oxide, tin zinc oxide, zinc oxide, zinc aluminum oxide, tin oxide, bismuth oxide, silicon nitride, silicon aluminum nitride, silicon tin nitride, and combinations thereof, but the present invention is not limited thereto. The metal oxide and/or the metal nitride may be doped with at least one element selected from the group consisting of bismuth (Bi), boron (B), aluminum (Al), silicon (Si), magnesium (Mg), antimony (Sb), beryllium (Be), and combinations thereof, and as a result, durability may be improved.

Optical performance of the low-emissivity coating film may be controlled by appropriately controlling materials and physical properties of the first dielectric layer 210 and the second dielectric layer 250. The first dielectric layer 210 and the second dielectric layer 250 may be made of a dielectric material having a refractive index of about 1.5 to about 2.3, and a thickness of the first dielectric layer 210 and the second dielectric layer 250 may be controlled to implement a desired target level of transmittance, reflectivity, transmission, reflection color, etc., depending on the refractive index values.

For example, the thickness of the first dielectric layer 210 and the second dielectric layer 250 may be about 5 nm to about 60 nm. In order to control total optical performance (transmittance, reflectivity, color index) of the multilayer thin film to meet target performance, the thickness of the first dielectric layer 210 and the second dielectric layer 250 may be variously controlled depending on positions and materials to be configured. By including the first dielectric layer 210 and the second dielectric layer 250 having the above-described range of thickness, the optical performance may be effectively controlled by the first dielectric layer 210 and the second dielectric layer 250, and an appropriate production speed may be implemented.

The first dielectric layer 210 and the second dielectric layer 250 may be made of a material having a light extinction coefficient similar to 0. When the light extinction coefficient is larger than 0, it means that an incident light is absorbed in the dielectric layer before it reaches the metal layer absorbing light, which is not preferred since securement of clear vision may be inhibited. Accordingly, the extinction coefficient of the first dielectric layer 210 and the second dielectric layer 250 may be less than about 0.1 in a visible light region (at a wavelength range of about 380 nm to about 780 nm). As a result, the first dielectric layer 210 and the second dielectric layer 250 may secure an excellent lighting property, thereby securing clear vision.

The low-emissivity layer 230 is a layer made of an electrically conductive material having a low emissivity, for example, a metal, and has a low sheet resistance, and accordingly, a low emissivity. For example, the low-emissivity layer 230 may have an emissivity of about 0.01 to about 0.3, specifically, about 0.01 to about 0.2, more specifically, about 0.01 to about 0.1, and still more specifically, about 0.01 to about 0.08.

The low-emissivity layer 230 having the above-described range of emissivity may simultaneously implement an excellent lighting property and an insulation effect by appropriately controlling visible light transmittance and infrared emissivity. In the low-emissivity layer 230 having the above-described range of emissivity, a sheet resistance of a material forming the thin film may be, for example, about 0.78 Ω/sq to about 6.42 Ω/sq, but the sheet resistance thereof is not limited thereto.

The low-emissivity layer 230 functions to selectively transmit and reflect solar radiant ray, and specifically, has a low emissivity since reflectivity for radiant ray in an infrared region is high. The low-emissivity layer 230 may include at least one selected from the group consisting of silver (Ag), gold (Au), copper (Cu), aluminum (Al), platinum (Pt), ion-doped metal oxides, and combinations thereof, but the present invention is not limited thereto. For the low-emissivity layer 230, metals capable of implementing low-emissivity performance known in the art may be used without limitation. The ion-doped metal oxide may include indium tin oxide (ITO), fluorine-doped tin oxide (FTO), aluminum (Al)-doped zinc oxide (AZO), gallium zinc oxide (GZO), etc. In an exemplary embodiment of the present invention, the low-emissivity layer 230 may be a layer made of silver (Ag), and as a result, the low-emissivity coating film may implement high electrical conductivity, a low absorption rate in a visible light region, durability, etc.

For example, the low-emissivity layer 230 may have a thickness of about 5 nm to about 25 nm. The low-emissivity layer 230 having the above-described range of thickness is appropriate for simultaneously implementing low infrared emissivity and high visible light transmittance.

The first low-emissivity protection layer 220 and the second low-emissivity protection layer 240 are made of a metal having excellent light absorption performance to control sunlight. Color that is implemented by low-emissivity coating film may be controlled by controlling a material, a thickness, etc., of the first low-emissivity protection layer 220 and the second low-emissivity protection layer 240.

The extinction coefficient in the visible light region of the first low-emissivity protection layer 220 and the second low-emissivity protection layer 240 may be about 1.5 to about 3.5. The extinction coefficient is a value derived from an optical constant which is a unique characteristic of a material, wherein the optical constant is represented by n-iK. Here, n which is a real part indicates a refractive index, and k which is an imaginary part indicates an extinction coefficient (which is also referred to as an absorption coefficient, an light absorption coefficient, a light extinction coefficient, etc.) The extinction coefficient is a function of wavelength (k), and it is general that an extinction coefficient of the metal is larger than 0. When the extinction coefficient (k) and the absorption coefficient ($\alpha$) satisfy a relationship of $\alpha(4\pi k)/\lambda$, and the absorption coefficient ($\alpha$) and a thickness of a medium through which light passes (d) satisfy a relationship of $I=I0\exp(-\alpha d)$, intensity (I) of light passing through the medium is smaller than intensity (TO) of incident light due to light absorption by the medium. In the first low-emissivity protection layer 220 and the second low-emissivity protection layer 240, the metal satisfying the above-described range of the extinction coefficient in the visible light region is used to absorb a predetermined portion of visible light, thereby allowing the low-emissivity coating film to have a predetermined color.

The first low-emissivity protection layer 220 or the second low-emissivity protection layer 240 may include, for example, at least one selected from the group consisting of nickel (Ni), chromium (Cr), nickel (Ni)-chromium (Cr) alloy, titanium (Ti) and combinations thereof, but the present invention is not limited thereto.

For example, the thickness of the first low-emissivity protection layer 220 or the second low-emissivity protection layer 240 may be about 0.5 nm to about 5 nm. The low-emissivity coating film may include the first low-emissivity protection layer 220 or the second low-emissivity protection layer 240 having the above-described range of thickness, thereby serving as the low-emissivity protection layer and being controlled to have a predetermined transmittance and reflectivity.

Uppermost Coating Layer (300)

The uppermost coating layer 300 may have a multilayer structure sequentially including, from the low-emissivity coating layer 200, the metal layer 310, the metal oxide layer 320 and the silicon-based composite metal oxynitride layer 330.

The metal layer 310 is formed by deposition on the low-emissivity coating layer 200. When the metal oxide layer 320 is formed by partially oxidizing a surface of the metal layer 310 through a post oxidation process of the surface of the metal layer 310, the metal layer may mean a layer that is not partially oxidized but remains. Due to the formation of the metal layer 310, the low-emissivity coating film has excellent chemical properties.

The metal layer 310 may include at least one metal selected from the group consisting of silicon (Si), aluminum (Al), titanium (Ti), zirconium (Zr), indium (In), tin (Sn), thallium (Tl), lead (Pb), Tin (Sb), bismuth (Bi), hafnium (Hf), vanadium (V), niobium (Nb), tantalum (Ta), and combinations thereof, and preferably, may include at least one metal selected from the group consisting of silicon, aluminum, titanium, zirconium, silicon-based composite metal, titanium-based composite metal, zirconium-based composite metal, and combinations thereof, and more preferably, may include zirconium or zirconium-based composite metal, but the present invention is not limited thereto. The metal layer 310 may inhibit a process in which chemical reaction materials introduced from the outside, for example, $O_2$, $H_2O$, $Na^+$, etc., diffuse into the low-emissivity layer 230, thereby improving chemical properties of the low-emissivity coating film.

That is, since the metal layer 310 is formed by deposition on the low-emissivity coating layer 200, the metal layer 310 inhibits diffusion of the chemical reaction materials such as $O_2$, $H_2O$, $Na^+$, etc., such that the low-emissivity coating film may have excellent chemical properties such as moisture resistance, acid resistance, basic resistance, etc.

In addition, the metal layer 310 preferably has a thickness of 0.5 nm to 5 nm, but the present invention is not limited thereto. For example, when the metal oxide layer 320 is formed by partially oxidizing the surface of the metal layer 310 through a post oxidation process of the surface of the metal layer 310, a thickness of the metal layer 310 may mean a final thickness that is not partially oxidized but remains. Here, when the thickness of the metal layer 310 is less than 0.5 nm, excellent chemical properties of the low-emissivity coating film, for example, moisture resistance, acid resistance, basic resistance, etc., are reduced, and when the thickness of the metal layer 310 is more than 5 nm, transmittance of the low-emissivity coating film is reduced.

The metal oxide layer 320 is formed on the metal layer 310. Due to the formation of the metal oxide layer 320, excellent mechanical properties of the low-emissivity coating film may be provided, and diffusion of the chemical reaction materials such as $O_2$, $H_2O$, $Na^+$, etc., may be inhibited to provide excellent chemical properties.

In particular, when the metal oxide layer 320 is formed by partially oxidizing the surface of the metal layer 310 through the post oxidation process of the surface of the metal layer 310, the metal is oxidized by the post oxidation process to form the metal oxide, which generates volume expansion. Due to the volume expansion, a high density metal oxide layer 320 may be formed to further increase hardness of the low-emissivity coating film.

That is, when the metal oxide layer 320 is formed by partially oxidizing the surface of the metal layer 310 through the post oxidation process of the surface of the metal layer 310, hardness of the low-emissivity coating film may be remarkably increased as compared to a case in which only the metal oxide layer is omitted among the uppermost coating layer.

The metal oxide layer 320 may include at least one metal oxide selected from silicon oxide ($SiO_2$), aluminum oxide ($Al_2O_3$), titanium oxide ($TiO_2$), zirconium oxide ($ZrO_2$), indium oxide ($In_2O_3$), tin oxide ($SnO_2$), thallium oxide ($TlO_2$), lead oxide ($PbO_2$), tin oxide ($SbO_2$), bismuth oxide ($Bi_2O_3$), hafnium oxide ($HfO_2$), vanadium oxide ($V_2O_3$), niobium oxide ($Nb_2O_5$), tantalum oxide ($Ta_2O_3$), and combinations thereof, and preferably, may include at least one selected from the group consisting of silicon oxide, aluminum oxide, titanium oxide, zirconium oxide, silicon-based composite metal oxide, titanium-based composite metal oxide, zirconium-based composite metal oxide, and combinations thereof, and more preferably, may include zirconium oxide or zirconium-based composite metal oxide, but the present invention is not limited thereto.

The metal oxide layer 320 preferably has a thickness of 0.5 nm to 5 nm, but the thickness of the metal oxide layer is not limited thereto. For example, when the metal oxide layer 320 is formed by partially oxidizing the surface of the metal layer 310 through the post oxidation process of the surface of the metal layer 310, an initial thickness of the metal layer 310 may be 1 nm to 10 nm. Through the post oxidation process, 0.5 nm to 5 nm of the surface of the metal layer 310 may be oxidized to be a thickness of the metal oxide layer 320.

The silicon-based composite metal oxynitride layer 330 is formed by deposition of silicon-based composite metal oxynitride, wherein the silicon-based composite metal oxynitride is an alloy oxynitride of which a main component is silicon among composite metals, and is capable of further improving mechanical properties such as abrasion resistance, etc., due to excellent hardness of the silicon-based composite metal oxynitride layer 330. Here, the deposition of the silicon-based composite metal oxynitride and the partial oxidization of the surface of the metal layer may be continuously performed in-situ.

The silicon-based composite metal oxynitride layer 330 may have a thickness of 2 nm to 20 nm. Here, when the thickness of the silicon-aluminum-based composite metal oxynitride layer 330 is less than 2 nm, mechanical properties such as abrasion resistance, etc., are reduced, and when the thickness of the silicon-based composite metal oxynitride layer 330 is more than 20 nm, transmittance is reduced.

The low-emissivity coating film may be formed in a multilayer thin film structure on the basis of the low-emissivity layer 230 selectively reflecting far-infrared ray among solar radiant rays, and accordingly, emissivity is reduced to provide excellent insulation performance by low emissivity, i.e., a low-e effect, on the low-emissivity coating film.

The low-emissivity coating film is a functional material formed in the above-described structure to have an energy saving effect of buildings by reflecting outdoor solar radiant heat in summer and preserving interior heat radiant heat in winter to minimize heat transfer between indoor and outdoor when applied to a coating film of a glass window.

"Emissivity" refers to a ratio in which energy having any specific wavelength is absorbed, transmitted, and reflected by an object. That is, the emissivity in the present specification refers to an absorption degree of infrared ray energy included in an infrared wavelength region, specifically, means a ratio of infrared ray energy to be absorbed with respect to infrared ray energy to be applied when far-infrared ray corresponding to a wavelength region of about 5 μm to about 50 μm, i.e, strong thermal action, is applied.

According to Kirchhoff's theory, since infrared energy absorbed by an object is the same as infrared energy emitted by the object, an absorption rate of the object is the same as an emission rate (emissivity) of the object.

In addition, since infrared energy that is not absorbed by the object is reflected on the surface of the object, emissivity is decreased as reflectivity to infrared energy of the object is increased. Upon expressing the above-description as a numerical relationship, an equation (emissivity=1−infrared reflectivity) is provided.

The emissivity may be measured by various methods generally known in the art, for example, may be measured by equipments such as Fourier transform infrared spectroscopy (FT-IR), etc., according to KSL2514 standard.

An absorption rate to far-infrared ray having strong thermal action as described above, i.e., emissivity, of any objects, for example, low-emissivity glass, etc., may represent a significantly important meaning in measuring insulation performance.

Therefore, the low-emissivity coating film according to the present invention may have excellent abrasion resistance which is a mechanical property, and may have excellent moisture resistance, acid resistance and basic resistance which are chemical properties.

In addition, the present invention provides a method for manufacturing a low-emissivity coating film including: (a) preparing a low-emissivity coating layer stacked on at least one surface of a base; (b) forming a metal layer by depositing a metal on the low-emissivity coating layer; and (c) forming a metal oxide layer on the metal layer, and forming a silicon-based composite metal oxynitride layer by depositing silicon-based composite metal oxynitride.

The step (a) is a step of preparing a low-emissivity coating layer stacked on at least one surface of a base, wherein the preparing of the low-emissivity coating layer stacked on at least one surface of the base is not particularly limited, but may be performed by lamination methods known in the art.

The step (b) is a step of forming the metal layer by depositing a metal on the low-emissivity coating layer, wherein the metal layer may be formed by depositing a metal on the low-emissivity coating layer using deposition methods known in the art.

The step (c) is a step of forming the metal oxide layer on the metal layer, and forming a silicon-based composite metal oxynitride layer by depositing silicon-based composite metal oxynitride. Here, the forming of the metal oxide layer is preferably performed by partially oxidizing the surface of the metal layer through a post oxidation process of the surface of the metal layer, but is not limited thereto. The post oxidation process may be performed by using at least one reactive gas selected from the group consisting of oxygen ($O_2$), nitrogen ($N_2$) and argon (Ar). Through the above-described post oxidation process such as ion beam, reactive sputtering, and plasma treatment, etc., the oxidation of the surface of the metal layer and deposition of the metal oxynitride may be continuously performed in-situ, thereby further increasing process efficiency.

Further, the present invention provides a functional construction material for window and doors including the low-emissivity coating film as described above. By including the low-emissivity coating film, the functional construction material secures excellent insulation performance and light property by the low-e effect and has excellent durability as described above, thereby improving heat resistance performance. The functional construction material may be processed by heat treatment for improving wind pressure resistance, and may be used as a building material for skyscraper.

Hereinafter, preferred exemplary embodiments of the present invention will be described to assist in understanding the present invention. However, the following exemplary embodiments are provided only to more easily understand the present invention, and accordingly, the present invention is not limited thereto.

EXAMPLE

Example 1

A low-emissivity coating layer having a multilayer structure and an uppermost coating layer having a multilayer structure stacked on a transparent glass substrate were manufactured as described below by using a Magnetron sputtering deposition device (Selcos Cetus-S).

A first dielectric layer having a thickness of 35 nm was formed by depositing silicon aluminum nitride on a transparent glass substrate having a thickness of 6 mm under argon/nitrogen (80 vol % of argon, 20 vol % of nitrogen) atmosphere. Then, a first low-emissivity protection layer having a thickness of 1 nm, a low-emissivity layer having a thickness of 7 nm, and a second low-emissivity protection layer having a thickness of 1 nm were formed by depositing nickel chromium (NiCr), silver (Ag) and nickel chromium (NiCr) on the first dielectric layer under argon (100 vol %) atmosphere, respectively. Then, a second dielectric layer having a thickness of 35 nm was formed by depositing silicon aluminum nitride on the second low-emissivity protection layer under argon/nitrogen (80 vol % of argon, 20 vol % of nitrogen) atmosphere, thereby manufacturing a low-emissivity coating layer having a multilayer structure.

Next, a zirconium layer having a thickness of 4 to 5 nm was formed by depositing zirconium on the second dielectric layer under argon (100 vol %) atmosphere Then, a zirconium oxide layer having a thickness of 3 to 4 nm was formed by partially oxidizing a surface of the zirconium layer through a post oxidation process of the surface of the metal layer, and silicon aluminum oxynitride was continuously deposited in-situ to form a silicon aluminum oxynitride layer having a thickness of 10 nm, thereby manufacturing an uppermost coating layer having a multilayer structure.

Comparative Example 1

Comparative Example 1 was performed by the same manner as Example 1 except for omitting the manufacture of the uppermost coating layer having the multilayer structure.

Comparative Example 2

Comparative Example 2 was performed by the same manner as Example 1 except for omitting the formation of the silicon aluminum oxynitride layer in the uppermost coating layer having the multilayer structure.

Comparative Example 3

Comparative Example 3 was performed by the same manner as Example 1 except for omitting the formation of the zirconium layer by oxidizing all parts of the zirconium layer in the uppermost coating layer having the multilayer structure.

Experimental Example

1. Evaluation of Abrasion Resistance

Test for abrasion resistance was conducted 100 times on the low-emissivity coating films manufactured by Example 1 and Comparative Examples 1 to 3 under condition of 1 $kg/mm^2$ by using a Taber abrasion tester (Manufacturer: Taber Abraser, Erichsen company, Model No. 5135 Rotary Platform abraser), and scratch forms and the number of scratches were calculated by observation using an optical microscope (×200). As a result, the measured scratch forms and the number of scratches were shown in Table 1 below and images thereof taken by an optical microscope were shown in FIG. 2. The number of scratches shown in Table 1 below was calculated by counting scratches having a width of 5 µm or more which was the minimum size, distinguishable by an optical microscope (×200).

TABLE 1

| Classification | Example 1 | Comparative Example 1 | Comparative Example 2 | Comparative Example 3 |
|---|---|---|---|---|
| Scratch form | Hairline scratch | Area scratch | Hairline scratch | Hairline scratch |
| Number of scratches | 3 | 10 | 8 | 6 |

Figure 2:
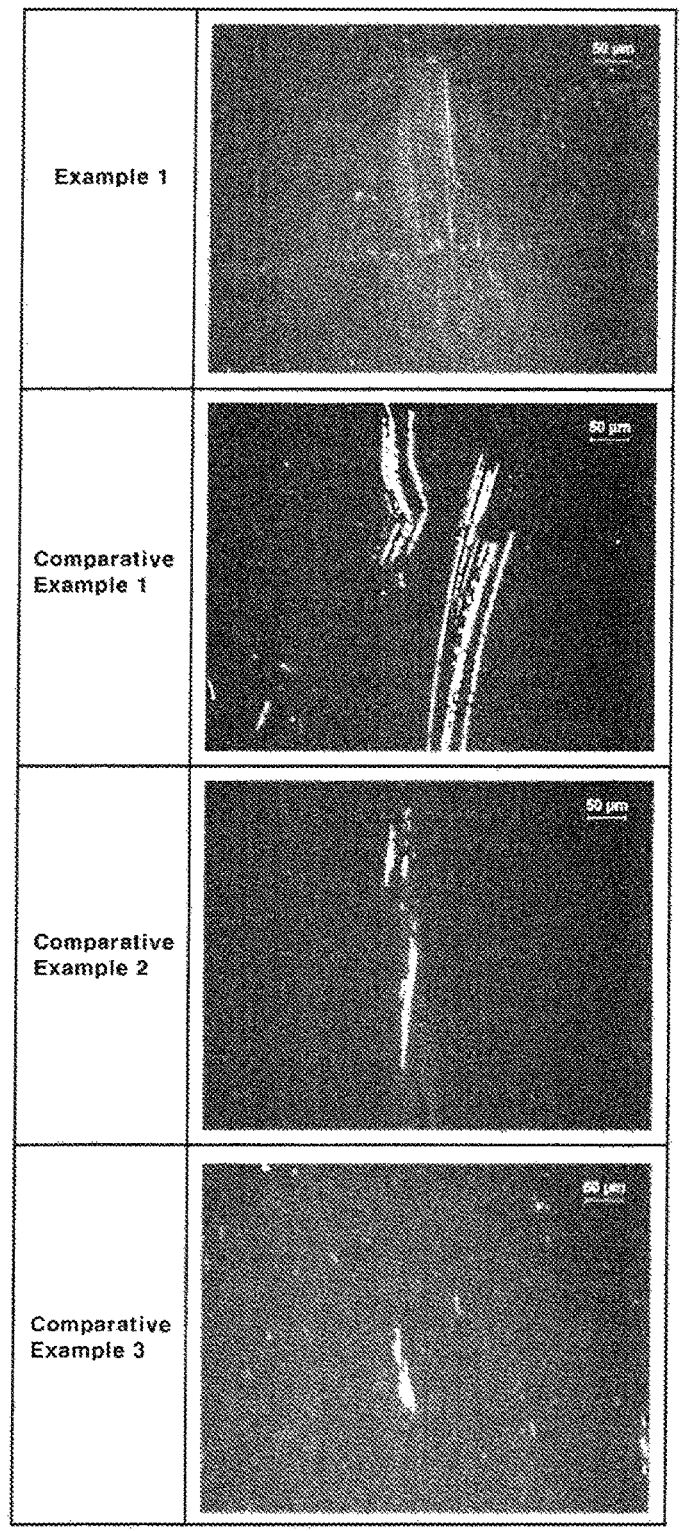
FIG. 2 shows a scratch degree of the low-emissivity coating film according to an exemplary embodiment of the present invention under specific condition, observed by an optical microscope.

FIG. 2 shows a scratch degree of the low-emissivity coating film according to an exemplary embodiment of the present invention under specific condition, observed by an optical microscope.

As shown in Table 1 and FIG. 2, it was confirmed that Comparative Example 1 had about 10 area scratches, such that abrasion resistance was poor, Comparative Example 2 also had about 8 hairline scratches, such that abrasion resistance was also poor, and Comparative Example 3 also had about 6 hairline scratches, such that abrasion resistance was also poor. Meanwhile, it was confirmed that Example 1 merely had about 3 hairline scratches, and accordingly, as compared to Comparative Examples 1 to 3, Example 1 had remarkably improved abrasion resistance due to the lamination structure of the uppermost coating layer having excellent hardness.

2. Evaluation of Moisture Resistance

Evaluation of moisture resistance (Day 3 and Day 7) was conducted on the low-emissivity coating films manufactured by Example 1 and Comparative Examples 1 to 3 under condition of 40° C. and 90% RH (humidity) by using a constant temperature and humidity chamber (LSIS Co., Ltd., EBS-35B), and corrosion degree was observed by using an optical microscope (×200). As a result, the number of corrosion points was calculated and shown in Table 2 below, and images thereof taken by an optical microscope were shown in FIG. 3.

TABLE 2

| Classification | Example 1 | Comparative Example 1 | Comparative Example 2 | Comparative Example 3 |
|---|---|---|---|---|
| Number of corrosion points (Day 3) | 2 | 200 or more | 21 | 71 |
| Number of corrosion points (Day 7) | 6 | 200 or more | 57 | 186 |

Figure 3:
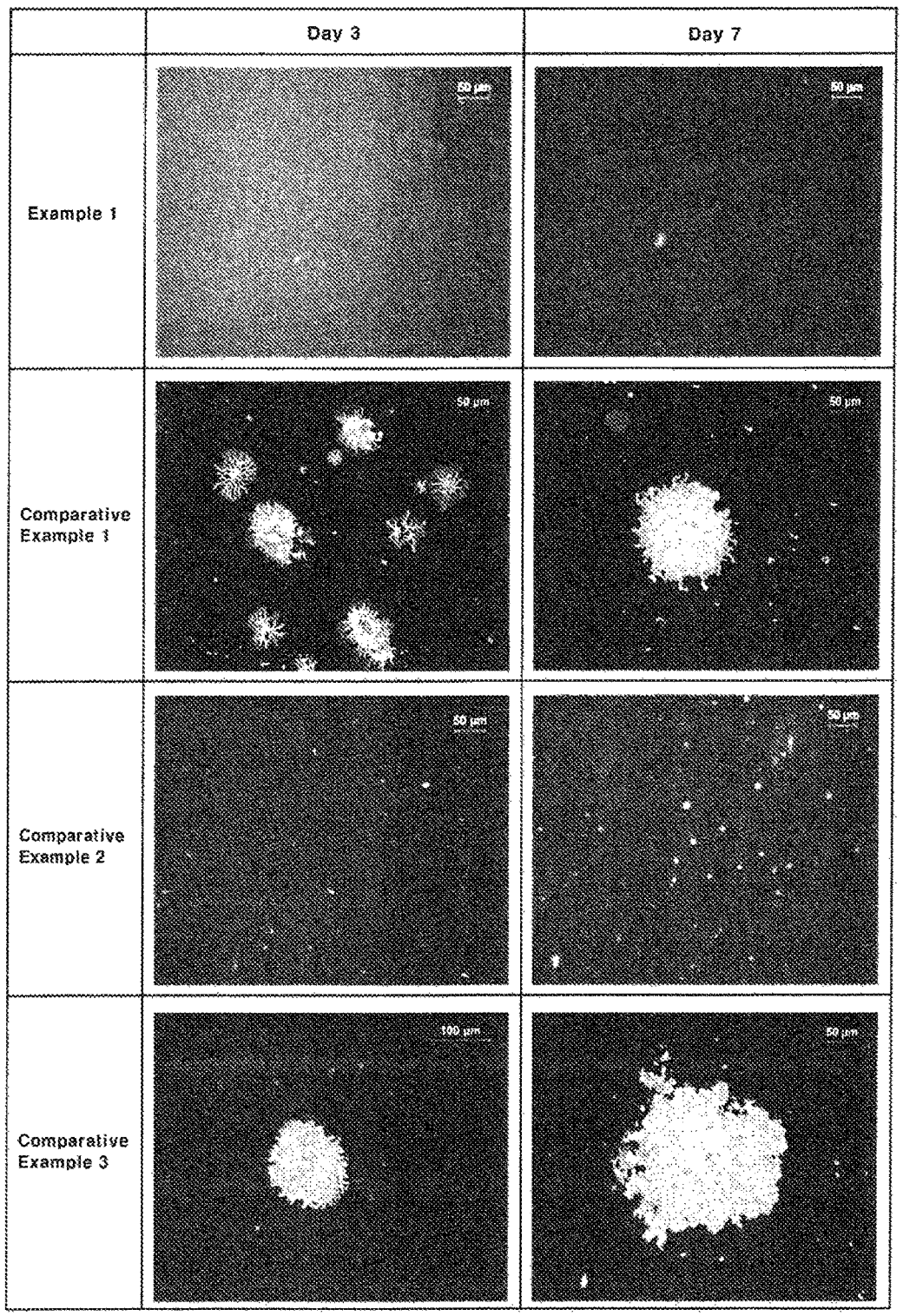
FIG. 3 shows a corrosion degree of the low-emissivity coating film according to an exemplary embodiment of the present invention under specific condition, observed by an optical microscope.

FIG. 3 shows a corrosion degree of the low-emissivity coating film according to an exemplary embodiment of the present invention under specific condition, observed by an optical microscope.

As shown in Table 2 and FIG. 3, it could be confirmed that Comparative Example 1 had 200 or more of corrosion points, such that corrosion degree was remarkably high, and further, Comparative Example 2 had 21 corrosion points on Day 3 and 57 corrosion points on Day 7, and Comparative Example 3 had 71 corrosion points on Day 3 and 186 corrosion points on Day 7, such that corrosion degree was also high. Meanwhile, it could be confirmed that the number of corrosion points was 2 on Day 3 and 6 on Day 7 in Example 1, such that corrosion rarely occurred in Example 1, and as compared to Comparative Examples 1 to 3, Example 1 included the zirconium layer, the zirconium oxide layer and the silicon aluminum oxynitride layer formed therein to inhibit diffusion of the chemical reaction materials introduced from the outside, for example, $O_2$, $H_2O$, Nat, etc., into the low-emissivity layer 230, thereby further improving moisture resistance of the low-emissivity coating film.

3. Evaluation of Acid Resistance

The low-emissivity coating films manufactured by Example 1 and Comparative Examples 1 to 3 were immersed in an HCl solution (Sigma-Aldrich, pH 2) at room temperature for 5 minutes, and change values of color index before and after immersion were measured by using a spectro colorimeter (Manufacturer: KONICA MINOLTA, Model No. VTLCM-700), and a graph having the results thereof was shown in FIG. 4.

Figure 4:
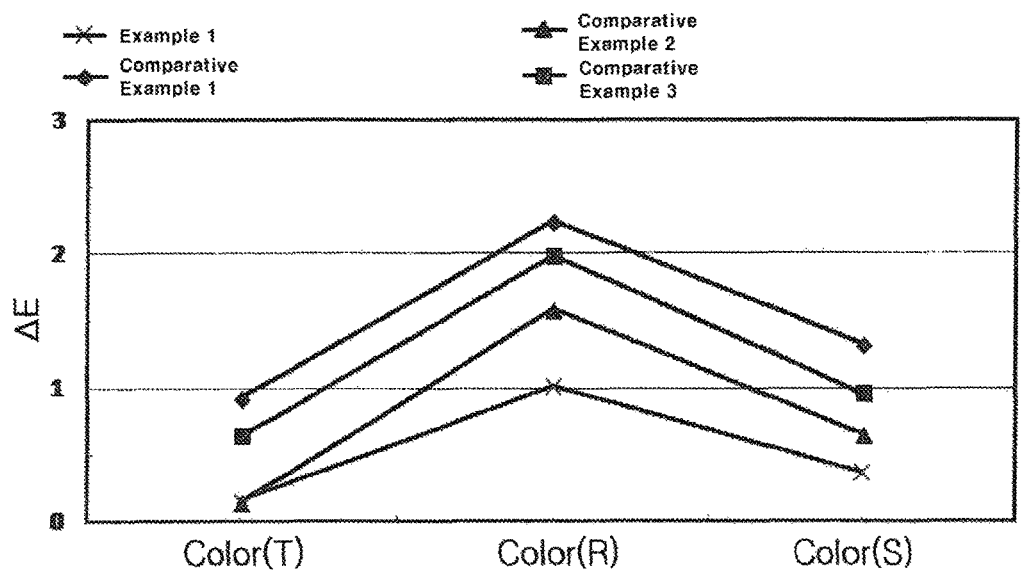
FIG. 4 shows a change value of a color index of the low-emissivity coating film according to an exemplary embodiment of the present invention under acidic condition.

FIG. 4 shows a change value of a color index of the low-emissivity coating film according to an exemplary embodiment of the present invention under acidic condition. Here, in FIG. 4, the color (T) in the X axis represents a color transmitted through a transparent glass substrate on which low-emissivity coating is coated, and the color (R) in the X axis represents a color reflected on the low-emissivity coating film, and the color (S) in the X axis represents a color reflected on the transparent glass substrate, and $\Delta E = (\Delta L^2 + \Delta a^2 + \Delta b^2)^{1/2}$ in the Y axis represents a change value of the color index.

As shown in FIG. 4, it could be confirmed that Comparative Examples 1 to 3 had a significantly large change in color index. Meanwhile, it could be confirmed that the change in color index rarely occurred in Example 1, and as compared to Comparative Examples 1 to 3, Example 1 included the zirconium layer, the zirconium oxide layer and the silicon aluminum oxynitride layer formed therein to inhibit diffusion of the chemical reaction materials introduced from the outside, for example, 02, $H_2O$, Nat, etc., into the low-emissivity layer 230, thereby further improving acid resistance of the low-emissivity coating film.

4. Evaluation of Basic Resistance

The low-emissivity coating films manufactured by Example 1 and Comparative Example 1 were immersed in a NaOH solution (pH 12) at room temperature for 5 minutes, and change values of color index before and after immersion were measured by using a spectro colorimeter (Manufacturer: KONICA MINOLTA, Model No. VTLCM-700), and a graph having the results thereof was shown in FIG. 5.

Figure 5:
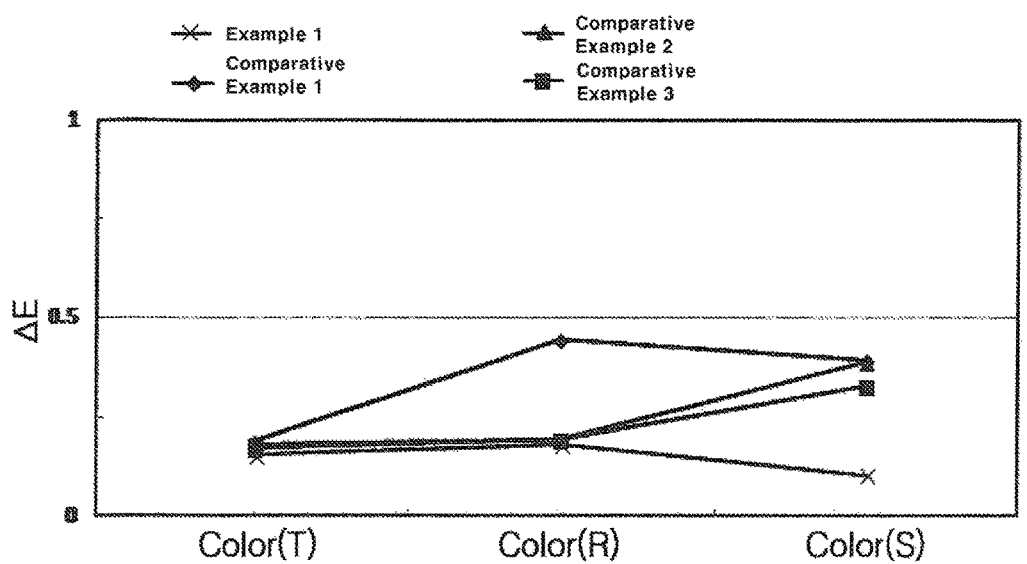
FIG. 5 shows a change value of a color index of the low-emissivity coating film according to an exemplary embodiment of the present invention under basic condition.

FIG. 5 shows a change value of a color index of the low-emissivity coating film according to an exemplary embodiment of the present invention under basic condition. Here, in FIG. 5, the color (T) in the X axis represents a color transmitted through a transparent glass substrate on which low-emissivity coating is coated, and the color (R) in the X axis represents a color reflected on the low-emissivity coating film, and the color (S) in the X axis represents a color reflected on the transparent glass substrate, and $\Delta E=(\Delta L^2+\Delta a^2+\Delta b^2)^{1/2}$ in the Y axis represents a change value of the color index.

As shown in FIG. 5, it could be confirmed that Comparative Examples 1 to 3 had a significantly large change in color index. Meanwhile, it could be confirmed that the change in color index rarely occurred in Example 1, and as compared to Comparative Examples 1 to 3, Example 1 included the zirconium layer, the zirconium oxide layer and the silicon aluminum oxynitride layer formed therein to inhibit diffusion of the chemical reaction materials introduced from the outside, for example, $O_2$, $H_2O$, $Na^+$, etc., into the low-emissivity layer 230, thereby further improving basic resistance of the low-emissivity coating film.

The above description of the present invention is provided for illustrative purposes, and it will be understood to those skilled in the art that the exemplary embodiments can be easily modified into various forms without changing the technical spirit or essential features of the present invention. Accordingly, the exemplary embodiments described herein are provided by way of example only in all aspects and should not be construed as being limited thereto.

The invention claimed is:

1. A low-emissivity coating film consisting of:
   a substrate formed of a glass or a transparent plastic;
   a low-emissivity coating layer on a surface of the substrate; and
   an uppermost coating layer on the low-emissivity coating layer,
   wherein
   the uppermost coating layer consisting of, from the low-emissivity coating layer, a metal layer, a metal oxide layer and a silicon-based composite metal oxynitride layer,
   the low-emissivity coating layer sequentially consisting of, from the substrate, a first dielectric layer, a first low-emissivity protection layer, a low-emissivity layer, a second low-emissivity protection layer, and a second dielectric layer,
   the metal oxide layer is formed by partially oxidizing the surface of the metal layer through a post oxidation process of the surface of the metal layer,
   the first dielectric layer or the second dielectric layer comprises at least one selected from the group consisting of silicon nitride, silicon aluminum nitride, silicon tin nitride, and combinations thereof,
   the substrate has a thickness of 2 mm to 12 mm,
   the first dielectric layer has a thickness of 5 nm to 35 nm,
   the first low-emissivity protection layer has a thickness of 0.5 nm to 1 nm,
   the low-emissivity layer has a thickness of 5 nm to 7 nm,
   the second low-emissivity protection layer has a thickness of 0.5 nm to 1 nm,
   the second dielectric layer has a thickness of 5 nm to 35 nm, and
   the silicon-based composite metal oxynitride layer has a thickness of 2 nm to 20 nm.

2. The low-emissivity coating film of claim 1, wherein the metal layer includes at least one selected from silicon, aluminum, titanium, zirconium, silicon-based composite metal, titanium-based composite metal, zirconium-based composite metal, and combinations thereof.

3. The low-emissivity coating film of claim 1, wherein the metal oxide layer includes at least one selected from silicon oxide, aluminum oxide, titanium oxide, zirconium oxide, silicon-based composite metal oxide, titanium-based composite metal oxide, zirconium-based composite metal oxide, and combinations thereof.

4. The low-emissivity coating film of claim 1, wherein the first dielectric layer or the second dielectric layer includes at least one doped with at least one element selected from the group consisting of bismuth (Bi), boron (B), aluminum (Al), silicon (Si), magnesium (Mg), antimony (Sb), beryllium (Be), and combinations thereof.

5. The low-emissivity coating film of claim 1, wherein the first low-emissivity protection layer or the second low-emissivity protection layer includes at least one selected from the group consisting of nickel (Ni), chromium (Cr), nickel (Ni)-chromium (Cr) alloy, titanium (Ti) and combinations thereof.

6. The low-emissivity coating film of claim 1, wherein the low-emissivity layer includes at least one selected from the group consisting of silver (Ag), gold (Au), copper (Cu), aluminum (Al), platinum (Pt), ion-doped metal oxides, and combinations thereof.

7. The low-emissivity coating film of claim 1, wherein the metal layer has a thickness of 0.5 nm to 5 nm.

8. The low-emissivity coating film of claim 1, wherein the metal oxide layer has a thickness of 0.5 nm to 5 nm.

9. The low-emissivity coating film of claim 1, wherein the silicon-based composite metal oxynitride layer comprises silicon aluminum oxynitride.

10. The low-emissivity coating film of claim 1, wherein the silicon-based composite metal oxynitride layer is the uppermost layer of the low-emissivity coating film.

11. A functional construction material for window and doors, said construction material comprising a low-emissivity coating film, wherein the low-emissivity coating film consists of:
    a substrate formed of a glass or a transparent plastic;
    a low-emissivity coating layer on a surface of the substrate; and
    an uppermost coating layer on the low-emissivity coating layer,
    wherein
    the uppermost coating layer consisting of, from the low-emissivity coating layer, a metal layer, a metal oxide layer and a silicon-based composite metal oxynitride layer,
    the low-emissivity coating layer sequentially consisting of, from the substrate, a first dielectric layer, a first low-emissivity protection layer, a low-emissivity layer, a second low-emissivity protection layer, and a second dielectric layer,
    the metal oxide layer is formed by partially oxidizing the surface of the metal layer through a post oxidation process of the surface of the metal layer,
    the first dielectric layer or the second dielectric layer comprises at least one selected from the group consisting of silicon nitride, silicon aluminum nitride, silicon tin nitride, and combinations thereof,
    the substrate has a thickness of 2 mm to 12 mm,
    the first dielectric layer has a thickness of 5 nm to 35 nm,
    the first low-emissivity protection layer has a thickness of 0.5 nm to 1 nm,
    the low-emissivity layer has a thickness of 5 nm to 7 nm,
    the second low-emissivity protection layer has a thickness of 0.5 nm to 1 nm,
    the second dielectric layer has a thickness of 5 nm to 35 nm, and the silicon-based composite metal oxynitride layer has a thickness of 2 nm to 20 nm.

* * * * *